United States Patent [19]

Mencik et al.

[11] Patent Number: 5,425,647

[45] Date of Patent: Jun. 20, 1995

[54] SPLIT CONDUCTIVE PAD FOR MOUNTING COMPONENTS TO A CIRCUIT BOARD

[75] Inventors: Michael J. Mencik; Michael E. Jarboe, both of Lauderhill, Fla.

[73] Assignee: AlliedSignal Inc., Morris Township, Morris County, N.J.

[21] Appl. No.: 191,051

[22] Filed: Feb. 2, 1994

Related U.S. Application Data

[63] Continuation of Ser. No. 875,887, Apr. 29, 1992, abandoned.

[51] Int. Cl.6 .......................... H01R 9/09; H01R 4/02
[52] U.S. Cl. ........................ 439/83; 361/760;
  361/768; 361/807; 361/808; 361/770; 439/78;
  439/876
[58] Field of Search ............... 361/382, 383, 400, 768,
  361/774, 760, 763, 767, 770, 777, 807, 808, 811;
  439/55, 485–487, 876, 78, 83; 174/138 G;
  228/180.21, 180.22; 257/723, 724

[56] References Cited

U.S. PATENT DOCUMENTS

| | | | |
|---|---|---|---|
| 3,770,874 | 11/1973 | Krieger et al. | 439/876 |
| 3,778,530 | 12/1973 | Reimann | 439/55 |
| 4,811,081 | 3/1989 | Lyden | 439/91 |
| 5,089,936 | 2/1992 | Kojima et al. | 439/485 |
| 5,206,795 | 4/1993 | Belanger, Jr. | 361/398 |
| 5,249,098 | 9/1993 | Rostoker et al. | 361/600 |

FOREIGN PATENT DOCUMENTS 2-237091  9/1990  Japan ..................... 439/78

*Primary Examiner*—Steven C. Bishop
*Attorney, Agent, or Firm*—Verne E. Kreger, Jr.

[57] ABSTRACT

A component is mounted to a circuit board using two spaced apart conductive pad portions that make electrical contact with a terminal of the component. The space between the conductive pad portions provides an additional path through which a cleaning solution and debris can flow.

4 Claims, 3 Drawing Sheets

SPLIT CONDUCTIVE PAD FOR MOUNTING COMPONENTS TO A CIRCUIT BOARD

This application is a continuation of application Ser. No. 07/875,887, filed Apr. 29, 1992, now abandoned.

BACKGROUND OF THE INVENTION

1. Field of the Invention

The present invention relates to circuit boards, more specifically it relates to mounting components on a circuit board.

2. Description of the Related Art

Typically, the surface of a circuit board contains conductive paths and conductive pads. The conductive pads are used to connect a component to a conductive path which may be on an outer or inner surface of the circuit board. The outer surface of the circuit board is protected by a mask of nonconductive material. This mask usually covers the entire top surface of the circuit board except for the pads. The pads are left uncovered to permit soldering components to the pads.

FIG. 1 illustrates component 10, with conductive contacts 12 and 14, mounted to circuit board 16. Contact 12 is connected to pad 18 by solder 22 and contact 14 is connected to pad 20 by solder 24. Upper surface 26 of circuit board 16 is protected by mask 28. Mask 28 covers all of surface 26 except for the areas including and surrounding pads 18 and 20. Pads 18 and 20 are left uncovered so that electrical contact can be made with the conductive contacts of component 10.

FIG. 2 is a top view of circuit board 16 illustrating the areas not covered by mask 28. Areas 36 and 38 are the portions of upper surface 26 that are not covered by mask 28. Area 36 leaves pad 18 and a small portion of top surface 26 uncovered. Area 38 leaves pad 20 and a small portion of surface 26 uncovered.

Referring to FIG. 1, this component mounting technique results in space 44, which is the space between the top surface of mask 28 and the bottom surface of component 10, being rather small. A typical height for space 44 is approximately 0.002 inches.

During the manufacturing process, it is typical for solder flux and other residue to become trapped in space 44. In the past, this debris was removed by cleaning the assembled circuit board using CFCs. It has been learned that CFCs damage the earth's ozone layer, and therefore it is no longer desirable to use such a substance to remove the debris from space 44.

Water is one of the more desirable substitutes for a CFC cleaning solution. Unfortunately, water does not remove debris from space 44 as thoroughly as CFCs. Therefore, it is desirable to mount components to a circuit board in a fashion that allows thorough cleaning using water.

SUMMARY OF THE INVENTION

The present invention provides a split conductive pad to which a component conductive terminal can be mounted so that an electrical connection is provided between the component and a circuit board on which the split conductive pad is located. The split conductive pad comprises a first and a second conductive portion. The first and second conductive portions are spaced apart so that the component's conductive terminal can be in simultaneous attachment with each conductive portion.

The present invention provides additional paths through which a cleaning solution can flow and thereby facilitates removing debris from beneath the component. The additional paths enable thorough cleaning with water or other alternate cleaning solutions rather than a CFC solution, and thereby eliminates the need for using CFCs to remove debris from underneath components on circuit boards.

DETAILED DESCRIPTION OF THE INVENTION

Figure 1:
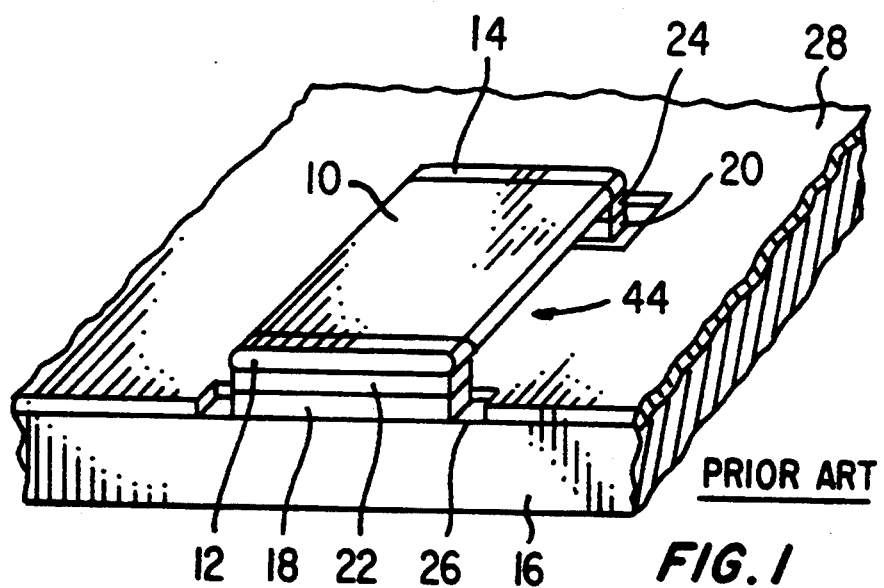
FIG. 1 illustrates how components were mounted to a circuit board in the past.
Figure 2:
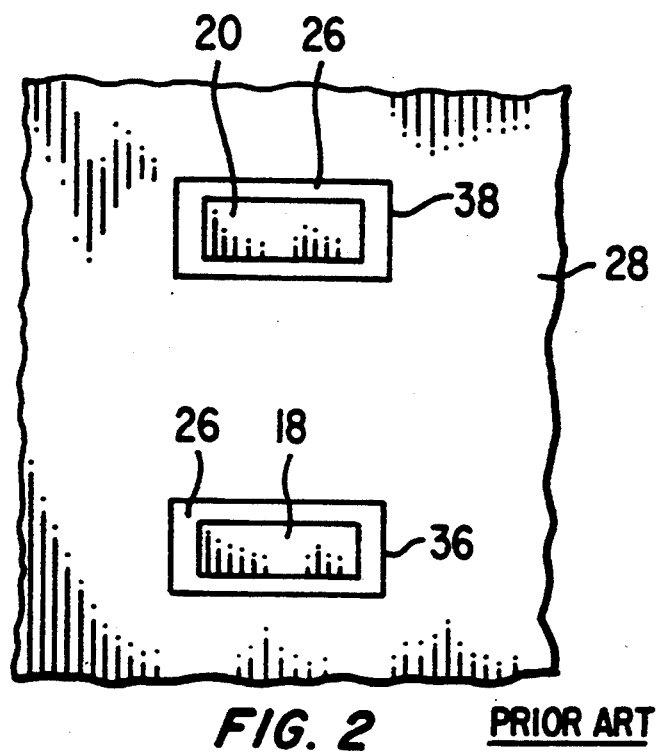
FIG. 2 illustrates a mask footprint for the arrangement of FIG. 1.
Figure 3:
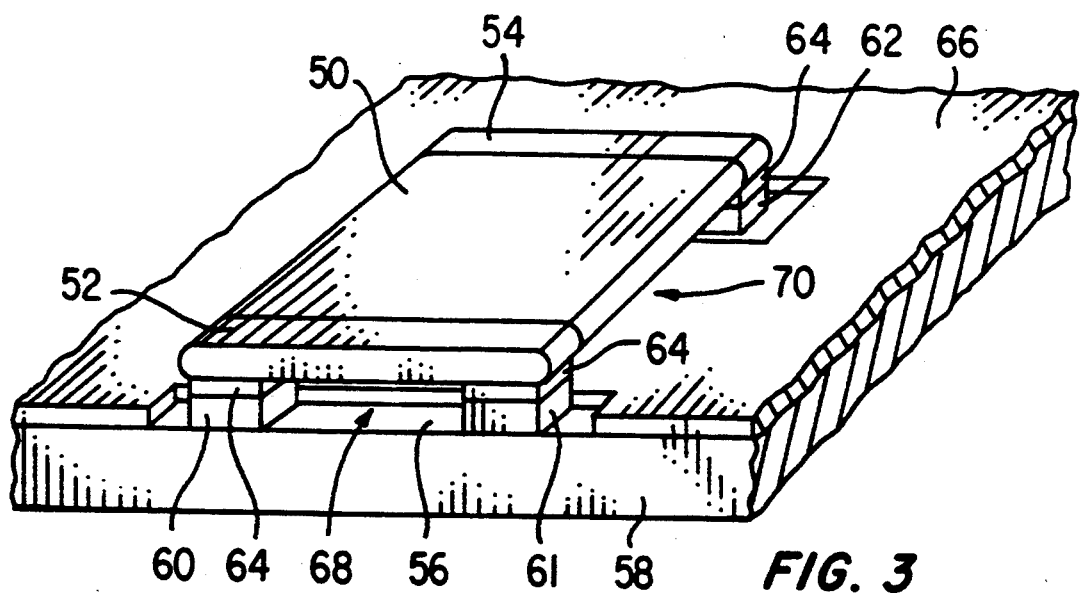
FIG. 3 illustrates a component mounted to a circuit board using split conductive pads.

FIG. 3 illustrates component 50 with conductive terminals 52 and 54. Component 50 is mounted to top surface 56 of circuit board 58. Conductive terminal 52 is attached to split conductive pad portion 60 and split conductive pad portion 61. Conductive terminal 54 is attached to split conductive pad portions 62 and 63. The conductive terminals are attached to the split conductive pad portions by solder 64. To facilitate this connection, it is preferable to tin plate the surfaces that will be contacting the solder. Top surface 56 of circuit board 58 is protected by nonconductive mask 66. Nonconductive mask 66 does not cover the split conductive pad portions or the areas immediately surrounding those portions.

The present invention provides pathways 68 and 69 in addition to pathway 70, and thereby facilitates cleaning debris from beneath component 50. Pathway 68 is formed by the space between conductive pad portions 60 and 61, and pathway 69 is formed by the space between conductive pad portions 62 and 63.

Figure 4:
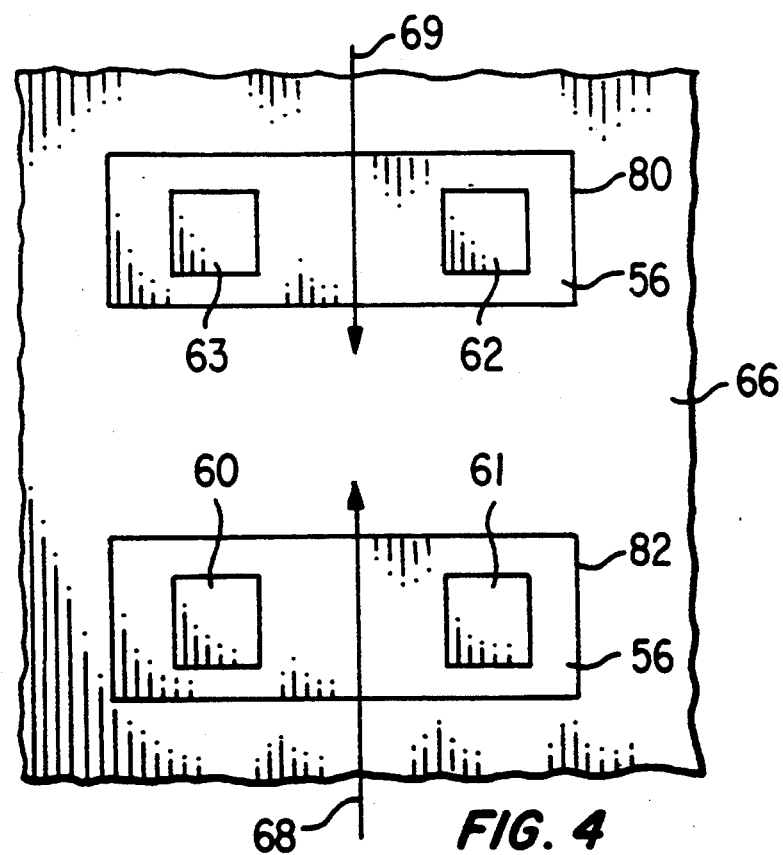
FIG. 4 illustrates a mask footprint for the arrangement of FIG. 3.

FIG. 4 illustrates a mask footprint for the arrangement shown in FIG. 3. Areas 80 and 82 indicate the portions of top surface 56 which are not covered by mask 66. Split conductive pad portions 60, 61, 62, and 63 are not covered by mask 66.

The flow of cleaning solution and debris is facilitated by keeping the space between the conductive pad portions unobstructed. To further facilitate the flow, conductive pad portions should be spaced apart at a maximum distance. Maximizing the spacing enlarges the area through which the cleaning solution and debris can flow. It is preferable to maximize the spacing between the conductive pad portions by positioning each conductive pad portion so that it attaches to the outer portion of the component's conductive terminal.

Figure 5:
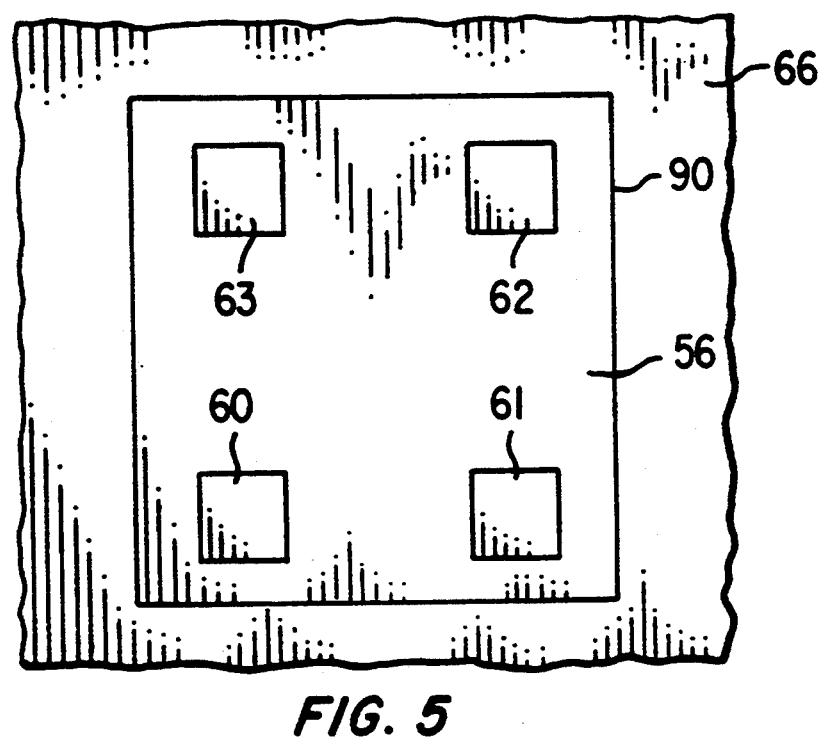
FIG. 5 illustrates a mask footprint when conductive paths are not routed beneath the component.

The flow of the cleaning solution and debris is further facilitated by eliminating mask 66 from the area beneath component 50. Mask 66 is not needed beneath component 50 when conductive paths are not routed under the component. The height of the space beneath component 50 is increased by not covering this area with mask 66, and thereby facilitates the flow of the cleaning solution and debris. FIG. 5 illustrates a mask footprint where mask 66 does not cover the area under component 50. Area 90 indicates the portion of top surface 56 which is not covered by mask 66. The uncovered area included conductive pad portions 60, 61, 62 and 63.

It is preferable to use between approximately 0.5 ounces of copper per square inch and approximately 3 ounces of copper per square inch for each conductive pad portion. It is more preferable to use approximately 1.5 ounces of copper per square inch.

We claim:

1. A split conductive pad electrically connected to a conductive terminal of a component and thus electrically connected to a single conductive path of a circuit board, said conductive pad comprising a first raised conductive portion, said first raised portion having a first top surface and a first bottom surface and a second raised conductive portion, said second raised portion having a second top surface and a second bottom surface wherein said first and second bottom surfaces are electrically connected to said conductive path in a way that said first conductive portion and said second conductive portion are physically separated and raised above the surface of said conductive path so that said conductive terminal is in simultaneous connection with said first top surface and said second top surface.

2. A split conductor pad assembly to facilitate the cleaning of an assembled circuit board comprising:
   a) a component having a first conductive terminal and a second conductive terminal;
   b) a circuit board having a first conductive path and a second conductive path;
   c) a first split conductive pad comprising a first conductive portion and a second conductive portion wherein both first and second conductive portions are electrically connected to said first conductive path in such a manner that said first and second conductive portions do not abut;
   d) a second split conductive pad comprising a third conductive portion and a fourth conductive portion wherein both third and fourth conductive portions are electrically connected to said second conductive path in such a manner that said third and forth conductive portions do not abut;
   e) connecting means for electrically connecting said first conductive terminal atop said first and second conductive portions;
   f) connecting means for electrically connecting said second conductive terminal atop said third and fourth conductive portions; and
   g) a plurality of pathways defined between said component and said circuit board;
   whereby said pathways provide a means in which a cleaning solution can flow between said component and said circuit board.

3. The semiconductor assembly of claim 2 wherein said connecting means is solder.

4. The semiconductor assembly of claim 2 wherein said cleaning solution is water.

* * * * *